United States Patent
Zhang et al.

(10) Patent No.: US 8,009,489 B2
(45) Date of Patent: Aug. 30, 2011

(54) MEMORY WITH READ CYCLE WRITE BACK

(75) Inventors: Shayan Zhang, Austin, TX (US); Jack M. Higman, Austin, TX (US); Prashant U. Kenkare, Austin, TX (US); Pelley H. Perry, Austin, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 168 days.

(21) Appl. No.: 12/474,078

(22) Filed: May 28, 2009

(65) Prior Publication Data

US 2010/0302837 A1  Dec. 2, 2010

(51) Int. Cl.
*G11C 7/00* (2006.01)
*G11C 7/02* (2006.01)

(52) U.S. Cl. .......... 365/189.16; 365/190; 365/191; 365/207

(58) Field of Classification Search .......... 365/189.16, 365/190, 207
See application file for complete search history.

(56) References Cited

U.S. PATENT DOCUMENTS

| | | | |
|---|---|---|---|
| 6,208,575 B1 * | 3/2001 | Proebsting | 365/208 |
| 7,203,886 B2 | 4/2007 | Brown et al. | |
| 2002/0136077 A1 * | 9/2002 | Spirkl | 365/227 |
| 2005/0114588 A1 | 5/2005 | Lucker et al. | |
| 2007/0291561 A1 | 12/2007 | Braceras et al. | |
| 2008/0031063 A1 | 2/2008 | Braceras et al. | |

* cited by examiner

*Primary Examiner* — Ly D Pham
(74) *Attorney, Agent, or Firm* — David G. Dolezal; James L. Clingan, Jr.

(57) ABSTRACT

A memory has a first bit line, a second bit line, and a word line. A memory cell is coupled to the word line and the first and second bit lines. A sense amplifier has a first input, a second input, a first output, and a second output. A pair of coupling transistors includes a first transistor and a second transistor. In one embodiment, the first transistor is coupled between the first bit line and the first input of the sense amplifier and the second transistor is coupled between the second bit line and the second input of the sense amplifier. A write back circuit is coupled to an output of the sense amplifier. The write back circuit writes back to the memory cell a value read from the memory cell during a read cycle.

28 Claims, 5 Drawing Sheets

MEMORY WITH READ CYCLE WRITE BACK

BACKGROUND OF THE INVENTION

1. Field of the Invention

This invention relates in general to a memory and specifically to writing back values read from a memory cell.

2. Description of the Related Art

FIG. 1 is a circuit diagram of a portion of a memory 101. In the example shown, memory 101 is a static random access memory (SRAM). An SRAM memory includes an array of volatile SRAM memory cells for storing data. The SRAM cells of memory 101 (with cells 103 and 105 shown in FIG. 1) are arranged in rows and columns. In one example, the cells of each column are coupled to a pair of bit lines (BLB and BL) that are used for reading and writing data in the cells of the column. The bit lines are connected to a sense amplifier 110 that is used to sense a voltage differential on the bit lines during a read cycle and amplifies the difference to provide an output based on the differential to determine a value stored in a memory cell. Sense amplifier 110 receives a sense enable signal (SE) for enabling the sense amplifier during a read operation and a sense amplifier precharge signal (SAPC) for precharging bit lines SAB and SA of the sense amplifier to an operating voltage level (VDD). In the example shown, sense amplifier 110 includes inverters 143 and 145.

In the example shown, cell 103 is a 6 transistor SRAM cell that includes access transistors 107 and 109 for coupling the memory cell data latch to the bit lines BLB and BL. The access transistors are controlled by a word line (e.g. WL1) and are made conductive when data is to be read or written to the cell. Each word line is coupled to access transistors of other cells located in the same row (not shown). In the example shown, the latch of cell 103 includes cross coupled transistors 111, 113, 115, and 117. Transistors 111 and 113 are P-channel transistors and transistors 115 and 117 are N-channel transistors. Each latch circuit includes two data storage nodes 119 and 121 which are designed to be biased at opposite complementary voltage states for storing data.

As the memory operating voltage (VDD in the diagram) is reduced, the operating voltage approaches the threshold voltages of the latch. Accordingly, the N-channel transistor (115 or 117) may not be fully conductive to hold a low voltage state (e.g. 0V) at storage node 119 or 121. If the one node is not held to the low voltage state, then the P-Channel transistor (111 or 113) may not be fully conductive to hold the other data storage node at the high voltage state.

These voltage problems are exacerbated during a read of the memory cell. For example, during a read of cell 103 when node 121 is at a low voltage state and node 119 is at a complementary high voltage state, the assertion of the word line signal causes transistor 109 to be conductive which pulls up slightly the low voltage at node 121 which may be referred to as read disturb. This causes the conductivity of transistor 111 to become weaker and increases the conductivity of transistor 115, thereby lowering the voltage of node 119. Lowering the voltage of node 119 reduces the conductivity of transistor 117 and increases the conductivity of transistor 113, thereby raising the voltage of node 121 further. For circuits where the memory operating voltage has been lowered, a lowering of the voltage at node 119 from the high voltage state due to the assertion of the word line, may cause transistor 117 to become non conductive to where node 121 switches voltage states. This may be referred to as read failure for an SRAM memory where reading the memory cell flips the state of the memory cell. Accordingly, reading an SRAM memory cell at a low operating voltage may cause the contents of the cell to become unreliable during a memory read.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

Embodiments are described herein of a memory that performs a write back of data read from a memory cell of the memory. This write back feature, in some embodiments, may enable a memory such as an SRAM memory to operate at lower operating voltages which may generate read failures in other similar memories without the feature.

Figure 1:
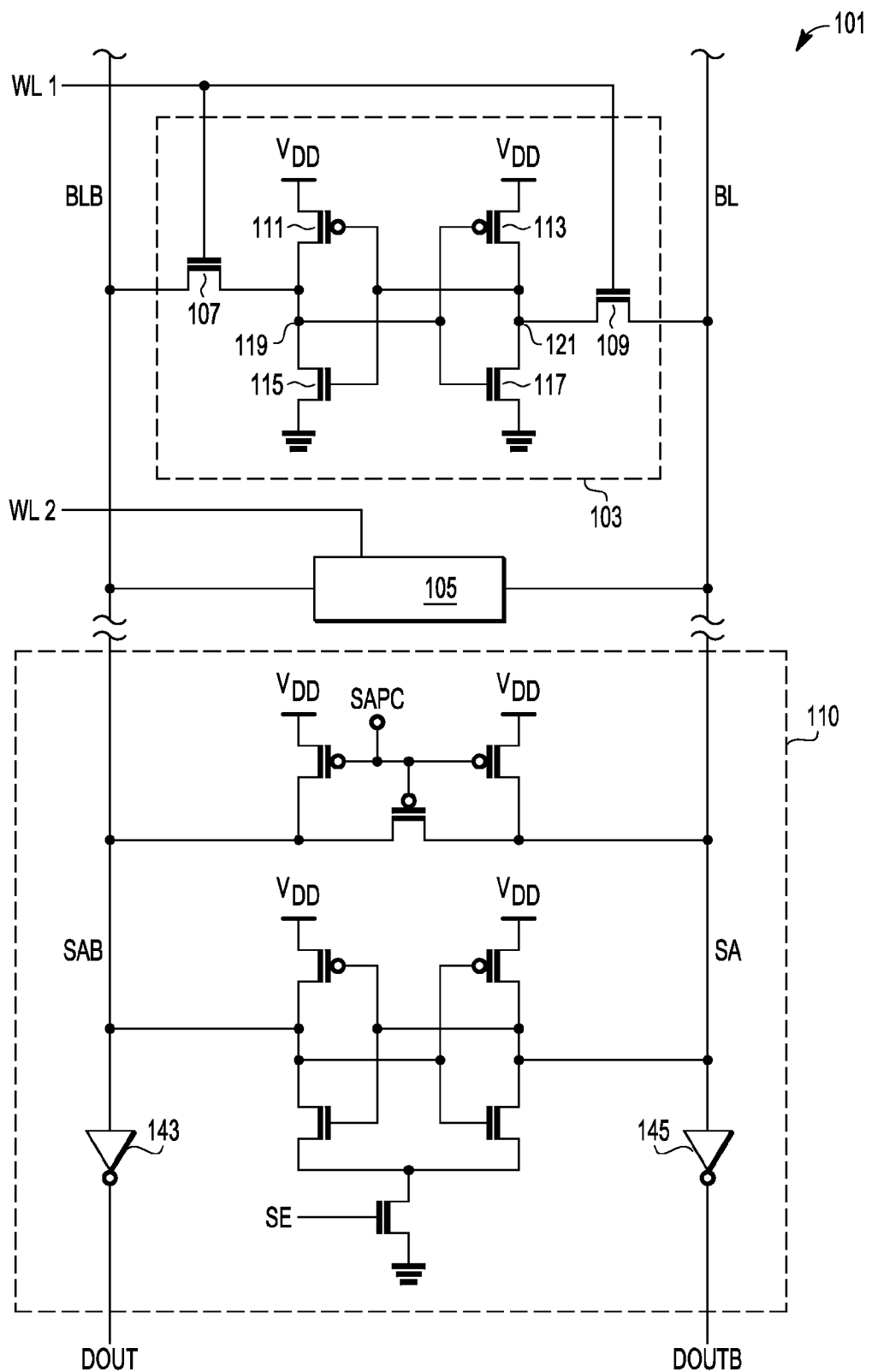
FIG. 1 is a circuit diagram of a portion of a prior art SRAM memory.
Figure 2:
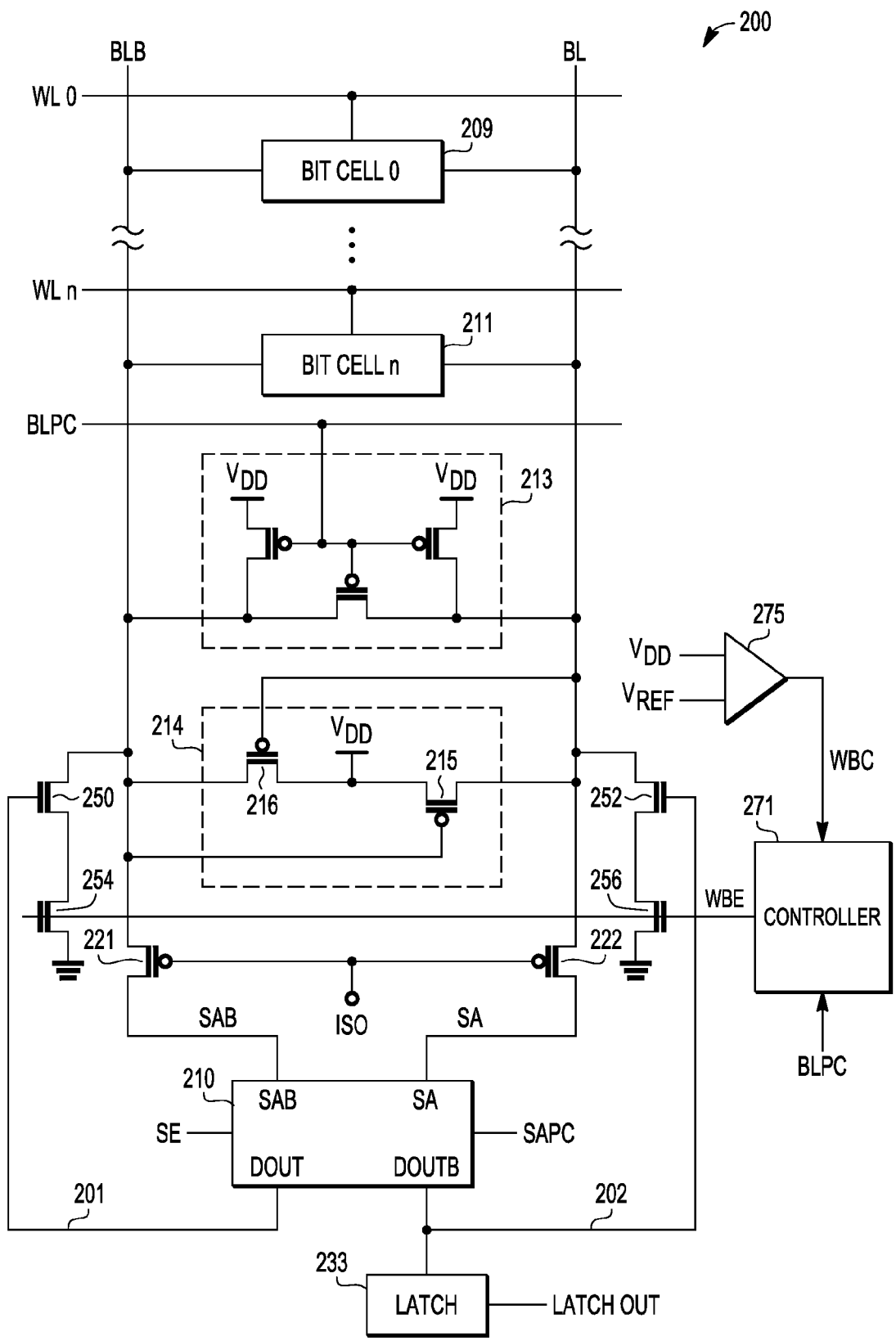
FIG. 2 is a circuit diagram of a portion of a memory according to one embodiment of the present invention.

FIG. 2 is a portion of a memory 200 that includes circuitry for writing back data read from a memory cell during a read cycle. Memory 200 is an SRAM memory and includes a plurality of SRAM memory cells that are arranged in rows and columns. In the embodiment shown, only one column is shown and only two rows are shown. In one embodiment, each memory cell (e.g. cells 209 and 211) has a 6 transistor configuration similar to cell 103 of FIG. 1. However, the memory cells may have other configurations in other embodiments.

Memory 200 includes a sense amplifier 210 which is similar to sense amplifier 110 in one embodiment. However, sense amplifier 210 may have other configurations in other embodiments. For example, in one embodiment, sense amplifier 210 does not include inverters 143 and 145. Sense amplifier 210 is used to sense a voltage differential produced on the bit lines during a read cycle and amplifies the differential to provide an output value indicative of the differential. Sense amplifier 210 receives a sense enable (SE) signal for enabling sense amplifier 210 during a read cycle of a memory cell and a sense amplifier precharge signal (SAPC) for precharging the sense amplifier bit lines SA and SAB to a supply voltage (e.g. VDD). Sense amplifier 210 is coupled to bit lines BL and BLB by isolation transistors 221 and 222. Transistors 221 and 222 are made non conductive to isolate the bit lines BL and BLB from sense amplifier 210 during memory operation. The DOUTB signal of sense amplifier 210 is latched in latch 233. Memory 200 also includes a precharge circuit 213 for precharging the bit lines based on the bit line precharge (BLPC signal). Memory 200 also includes a keeper circuit 214 that includes P-channel transistors 216 and 215 for preventing the bit line (either BL or BLB) at the high voltage state level from drifting to a low voltage state level. The BLPC signal, the SAPC signal, the SE signal, and the ISO signal are provided by a memory controller (not shown). In one embodiment, these signals may be provided by controller 271. The word line signals are provided by a row decoder (not shown).

Memory 200 includes circuitry for writing back data read by the sense amplifier to the memory cell from which it was read. Memory 200 includes feedback lines 201 and 202 for conveying the DOUT and DOUTB signals from the sense amplifier 210 for writing the determined value back to the memory cell via bit lines BL and BLB. Feedback lines 201 and 202 control transistors 250 and 252 respectively. Transistor 254 is coupled in series with transistor 250 and transistor 252 is coupled in series with transistors 256. The gates of transistors 254 and 256 are controlled by a write back enabled (WBE) signal provided by controller 271 that is asserted during a predetermined time during a read cycle.

During a read cycle, the bit line (BL or BLB) that is at the lower voltage level during the read is pulled to ground by either transistors 250 and 254 (for bit line BLB) or transistors 252 and 256 (for bit line BL) as determined by the outputs DOUT and DOUTB of sense amplifier 210 for writing the determined value back to the memory cell. In another embodiment, complementary outputs of latch 233 are coupled to feedback lines 201 and 202 rather than DOUT and DOUTB.

Memory 200 may include other rows, columns, sense amplifiers, and control circuitry (not shown). Memory 200 includes write circuitry (not shown) for writing data to the memory cells during a write cycle.

Figure 3:
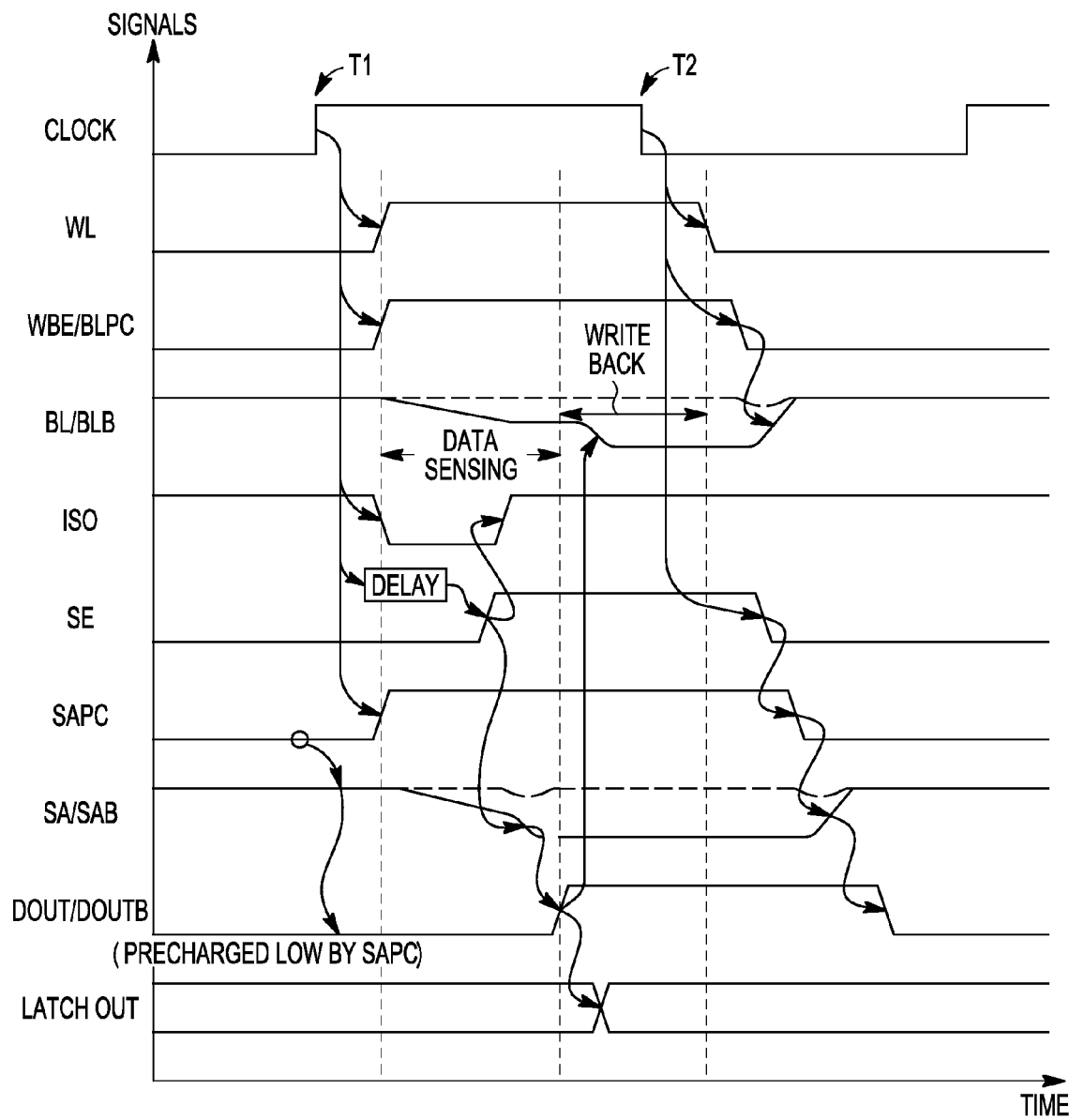
FIG. 3 is a timing diagram of an operation of the memory of FIG. 2 according to one embodiment of the present invention.

FIG. 3 is a timing diagram of a read cycle of memory 200. In the embodiment shown, the BLPC signal and WBE signal are the same signal. In other embodiments, the WBE signal follows the BLPC signal. In FIG. 3, several of the signal transitions are based on a clock signal. Prior to a read cycle, the WL signal is at a low voltage level (e.g. 0 volts) indicating that no word line is selected. The BLPC signal is at a low voltage level to precharge the bit lines BL and BLB at VDD. The ISO signal is at a high voltage level (e.g. VDD) such that transistors 221 and 222 are non conductive to isolate bit lines BL and BLB from sense amplifier 210. The LATCH OUT signal is latched at the value read by sense amplifier 210 during a previous read cycle.

A read cycle begins when, in response to the CLOCK signal transitioning states at T1, the WL signal, the BLPC signal, the ISO signal, and the SAPC signal change states. The ISO signal changing states to a low voltage level state couples the bit lines BL and BLB to sense amplifier 210. The BLPC signal transitioning to a high voltage level state ceases the precharging of the bit lines BL and BLB by decoupling them from VDD. The SAPC signal transitioning to a high voltage level state ceases precharging sense amplifier bit lines SA and SAB. The enabling of the word line (WL) (at the high voltage level state in the embodiment shown) of the cell being read (e.g. 209) causes the access transistors (e.g. 107 and 109) of the memory cells to be conductive to couple the storage nodes (e.g. nodes 119 and 121) of the cell to the bit lines. With the precharging of the bit lines ceasing, the voltage level of each bit line is pulled toward the voltage level of the storage node of the cell coupled to the bit line. Accordingly, one of the bit lines BL or BLB goes lower and a voltage differential between BL and BLB begins to appear. Because the ISO signal is at a low voltage level at this time, the SA and SAB bit lines are coupled to bit lines BL and BLB, respectively.

After a predetermined time from time T1, the sense enable (SE) signal is asserted to activate sense amplifier 210. In the embodiment shown, the SE signal is asserted high but may be asserted low in other embodiments. In response to the assertion of the SE signal, sense amplifier 210 amplifies the voltage differential of the SA and SAB bit lines such that one of DOUT or DOUTB switches to a high voltage level state (depending upon the value stored in the cell being read). DOUT or DOUTB switching to a high voltage level state causes the LATCH OUT signal to switch states to indicate the value of the memory cell being read.

Following the assertion of the SE signal, the ISO signal transitions to a high voltage value to isolate the BL and BLB bit lines from the SA and SAB bit lines respectively.

With the switching of the DOUT and DOUTB signal, the SRAM memory begins a write back portion of the read cycle. During the write back portion, the one of signals DOUT and DOUTB going to the high voltage state level makes conductive the one of transistors 250 or 252 whose gate is coupled to the output (DOUT or DOUTB) whose voltage is at the high voltage state level to pull the corresponding bit line and corresponding storage node (e.g. node 119 or 121) to a low voltage state level to rewrite the value to the cell that was read during the data sensing portion of the read cycle.

For example, if during a read cycle, bit line BLB was pulled toward a low voltage level by the voltage of the storage node of a memory cell coupled to bit line BLB, signal DOUT would transition to a high voltage state level to indicate data value (e.g. 1) stored in the memory cell. DOUT signal going high causes transistor 250 to be conductive to pull BLB to ground (or other supply voltage value in other embodiments). During this time the WBE signal is at a high voltage level to make transistors 254 and 256 conductive. BLB being pulled to ground causes a 1 value to be rewritten to the memory cell via keeper circuit 214. Thus, even if read failure occurs during the read of the memory cell and the memory cell flips logic states from a 1 to a 0, the write back phase of the read cycle will write back the 1 value to the memory cell.

Transistors 252 and 256 work in a similar way to pull bit line BL to ground (or other supply voltage in other embodiments) if a 0 value was read from a memory cell.

Providing a memory with a write back phase during a read cycle may in some embodiments, enable the memory (such as an SRAM memory) to operate at lower operating voltages that would cause read failure in other memories of the same type without the feature.

The CLOCK signal transitioning states at T2 causes the WL signal, the BLPC signal, and the SE signal to changes states. The WL signal going back to a low voltage state isolates the storage nodes of the memory cells from the bit lines. In the embodiment shown, the BLPC signal transitions to a low voltage state a short time after the transition of the WL signal to begin precharging the bit lines back to VDD. The transitioning of the BLPC signal (and correspondingly the WBE signal) causes transistors 250 and 252 to become non conductive, thereby ending the write back phase.

After the SE signal transitions to a low voltage level, the SAPC signal transitions to a low voltage level to begin precharging the SA and SAB bit lines. Precharging the SA and SAB bit lines pulls both SA and SAB bit lines back to VDD. Pulling the bit lines SA and SAB back to VDD causes the one of DOUT and DOUTB that was at a high voltage value to transition back to a low voltage value. With the circuit of FIG. 2, the WBE transitions to a low voltage level to end the write back phase prior to the DOUT/DOUTB signal going low.

Referring back to FIG. 2, in some embodiments, the write back feature could be selectively used during the operation of the memory, depending upon the voltage level of the memory operating voltage VDD. For example, memory 200 may be configured to operate at different memory operating voltages depending upon which power savings mode memory 200 is operating. For example, memory 200 is capable of operating at both VDD=1.5 volts and VDD=0.8 volts. When operating at VDD=1.5 volts, the write back feature is not needed and therefore is disabled. When VDD=0.8 volts, the write back feature is enabled.

In the embodiment shown, controller 271 gates the BLPC signal to enable the write back mode. When in write back mode, controller 271 provides the BLPC signal as the WBE signal wherein transistor 256 and 254 are made conductive during a portion of the read cycle when the bit lines are not being precharged. When the write back feature is not enabled, controller 271 provides the WBE signal at a low state such that transistors 254 and 256 do not turn on during the write cycle.

In the embodiment shown, controller 271 determines whether to enable the write back feature based upon whether the memory operating voltage VDD is above or below a reference voltage (Vref). For example, if the reference voltage is 1.0V, then controller 271 only enables the write back feature when VDD is below 1.0V. In one embodiment, the reference voltage would be programmable by writing a value to a register (not shown). In other embodiments, controller 271 may use other criteria for enabling or disabling the write back feature during a read cycle.

Providing a memory that has a write back feature that can be selectively enabled and disabled provides for a memory that may save energy when operating at a higher memory operating voltage. For example, when the low storage node of an SRAM cell is pulled up during a read, pulling it back to ground consumes energy. Also, if the data storage node is pulled back to ground during a write back, it takes more energy to pull the bit line back to VDD during a subsequent precharge cycle. If the memory operating voltage is high enough that a read of a memory cell does not cause the cell to change states, then disabling the write back feature may save energy during a read cycle of the memory cell.

FIG. 2 shows one embodiment for implementing a write back feature in a memory. However, such a feature may be implemented in other memory circuits of other configurations.

Figure 4:
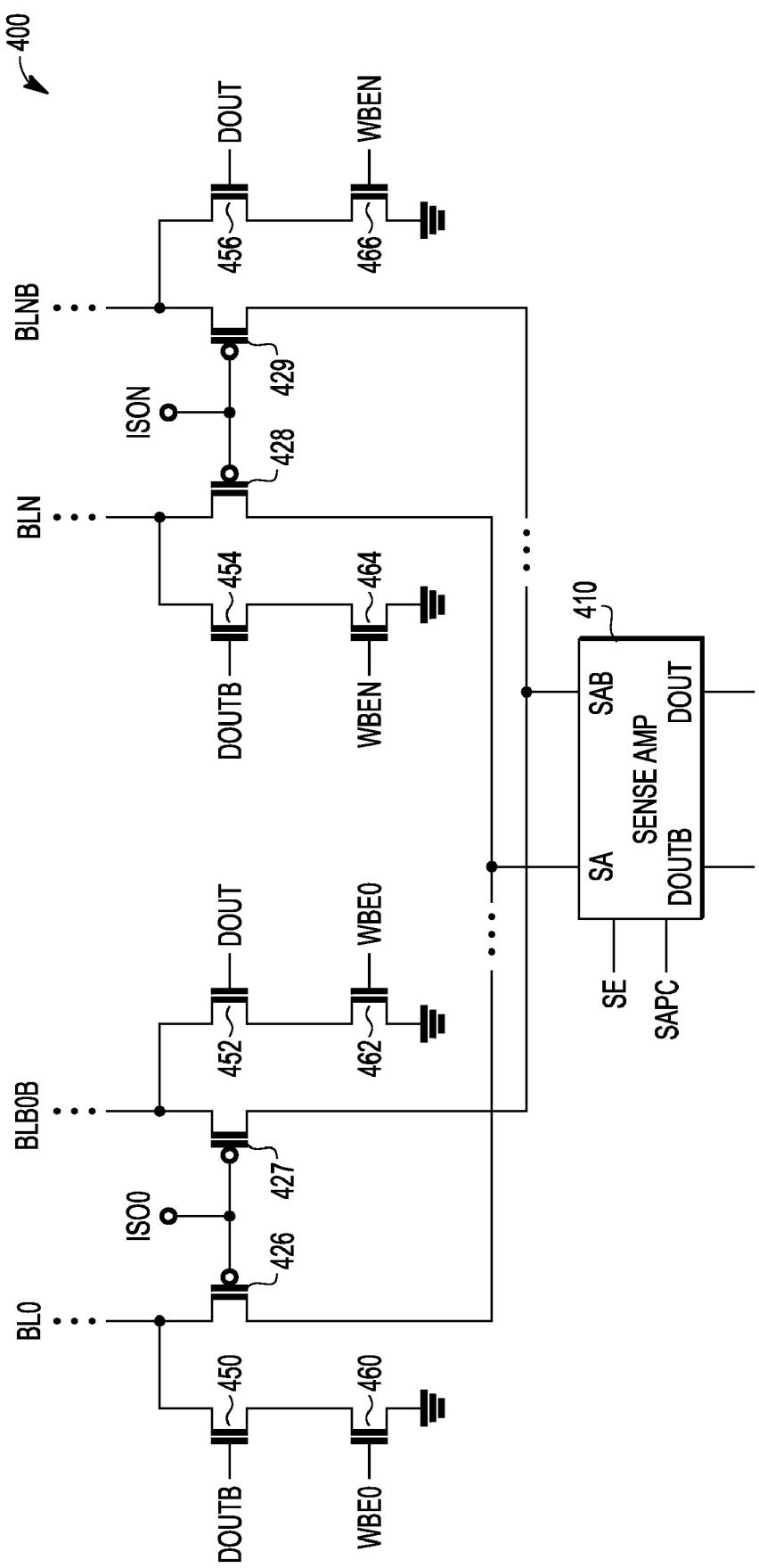
FIG. 4 is a circuit diagram of a portion of a memory according to one embodiment of the present invention.

FIG. 4 is a circuit diagram of another embodiment of an SRAM memory with a write back circuit. With the embodiment of FIG. 2, each sense amplifier is coupled to only one set of complementary bit lines. With the embodiment of FIG. 4, each sense amplifier can be coupled to multiple sets of complimentary bit lines. In FIG. 4, bit line pair BL0 and BL0B and bit line pair BLN and BLNB are each couplable to sense amplifier 410. Not shown in FIG. 4 are the memory cells coupled to the bit line pairs. Also not shown in FIG. 4 are other sense amplifiers and control circuitry of the memory.

During a read of a cell of one of the bit line pairs, the isolation transistors (e.g. transistors 426, 427, 428, and 429) of the other bit line pairs are non conductive to isolate those bit lines from sense amplifier 410. For example, if a cell of bit line pair BL0 and BL0B is being read, transistors 426 and 427 are conductive and transistors 428 and 429 are non conductive so that bit lines BLN and BLNB are isolated from sense amplifier 410. In the embodiment shown, the ISO0 and ISON signals are based on column select signals for those columns.

In the embodiment shown, the output signals DOUTB and DOUT are provided to each column for writing back the read values. For example, DOUTB is provided to the gates of transistors 450 and 454 and DOUT is provided to the gates of transistors 452 and 456.

The write back phase for each column is controlled by a write back enable signal (WBE0, WBEN) that is specific to each column. For example, the WBE0 signal is provided to transistors 460 and 462 of bit line pair BL0 and BL0B and the WBEN signal is provided to transistors 464 and 466. Each of signal WBE0 and WBEN is based on the column select for the column that the signal is being provided to. Accordingly, the write back feature is only enabled for the column that is being written to. In some embodiments, the write back feature to each column could be selectively enabled or disabled (e.g. depending on the operating voltage) as with the embodiment of FIG. 2.

Figure 5:
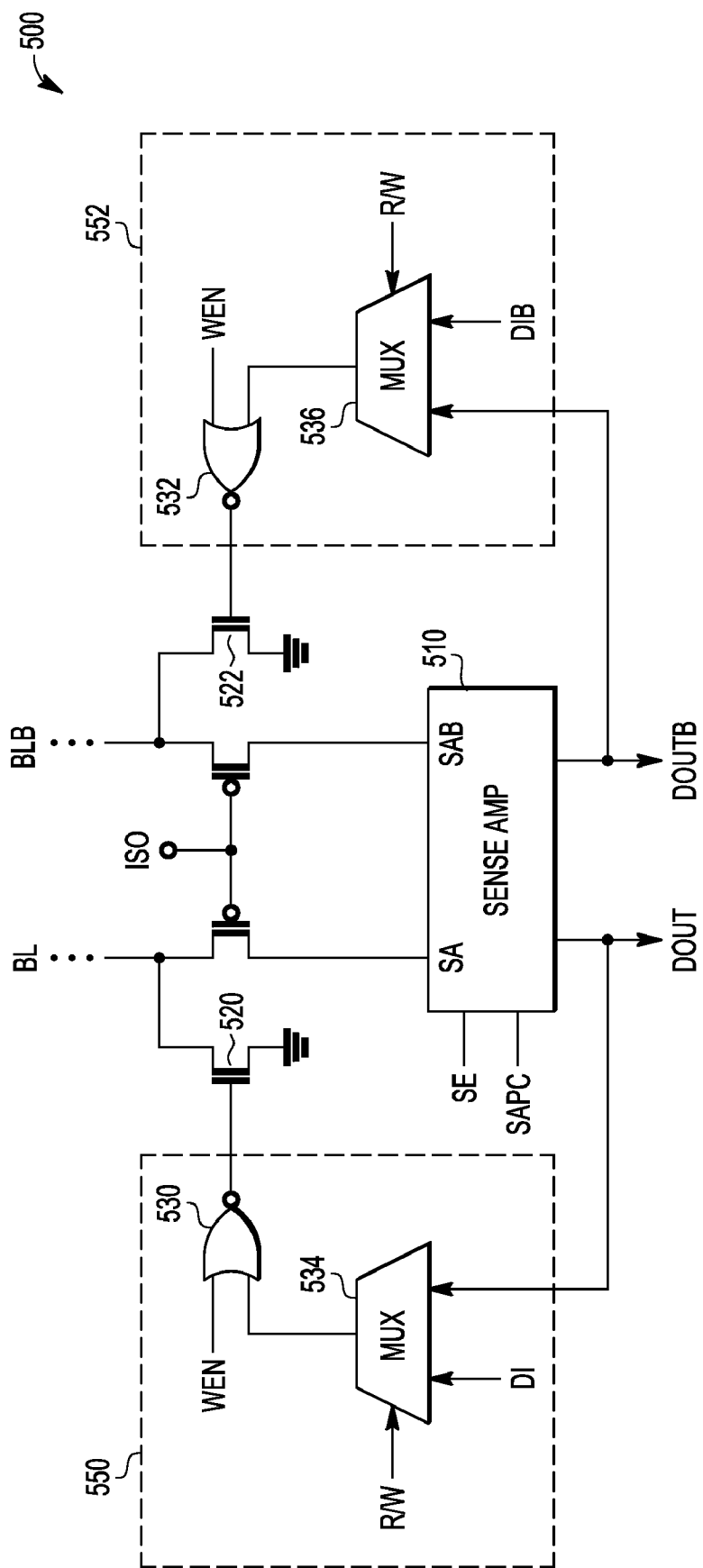
FIG. 5 is a circuit diagram of a portion of a memory according to one embodiment of the present invention.

FIG. 5 is a circuit diagram of a portion of an SRAM memory according to another embodiment of the present invention. The embodiment of FIG. 5 includes circuitry 550 and 552 that utilizes the same transistors 520 and 522 for the write back phase of a read cycle that are used for writing to the memory cells during a write cycle. In FIG. 5, the memory cells coupled to bit lines BL and BLB are not shown. In the embodiment shown, circuitry 550 receives both a signal from sense amplifier 510 and a Data In (DI) signal from a controller (not shown). The DI signal conveys data to be written to a cell coupled to the bit lines during a write cycle. The DOUT and DI signal are both inputted into a MUX 534 whose control input is the read/write (R/W) signal. Depending upon whether there is a read cycle or a write cycle, MUX 534 supplies either the DI signal (for a write cycle) or the DOUT signal (for a write back phase of a read cycle) to the input of NOR gate 530. The other input of NOR gate 530 receives a write enable (WEN) signal that controls (when in an asserted state) when transistor 520 can be conductive in response to DOUT or DI. During a read cycle, the WEN signal is in an asserted state at times similar to the WBE signal. When during a write cycle, the WEN signal is in the asserted state at times appropriate for a data write. In some embodiments, the WEN signal may be used to disable the write back feature during a read cycle if the memory operating voltage is above a certain threshold or for other reasons.

Circuitry 552 includes MUX 536 and NOR gate 532 and operates in a similar way to circuitry 550, except it receives the DOUTB and DIB (a complementary signal to the DI signal) signals.

Circuitry 550 and 552 may have other configurations for combining the write back feature with the write feature. For example, circuitry 550 could include two MUXes. A first MUX would be similar to MUX 534 and would receive both the DI and DOUT signals. The second MUX receives at one input the write enable signal for the write back feature and receives at the other input a write enable signal for the write cycle. The output of the first MUX is provided to the gate of a first transistor in series with transistor 520 and the output of the second MUX would be provided to the gate of transistor 520 (similar to transistors 250 and 254 in FIG. 2 where the first transistor would be located at a position similar to transistor 250 and the second transistor would be located at a position similar to transistor 254) Each MUX would be controlled by the R/W signal. In such an embodiment, circuitry 552 would include only one MUX whose output is provided to transistor 522 where the output of the second MUX of circuitry 550 would be provided to the gate of a transistor in series with transistor 522. With such an embodiment, both circuitry 550 and 552 could share the MUXed write enable signals.

Providing a memory that isolates the sense amplifier from the bit lines during write back phase enables the sense amplifier to operate faster due to the removal of the capacitance of the bit lines from the sense amplifier during sensing. A prior art U.S. patent application 2008/0031063 describes a solution for correcting read failure that occurs as a result of a read disturb that utilizes extra circuitry in the sense amplifier to maintain memory cell node stability. However, such a solution requires the sense amplifier to be coupled to a memory cell during amplification. Accordingly, with such a solution, the speed of the sense amplifier may be compromised.

With embodiments described herein, the write back generally occurs with the sense amplifier being isolated from the bit lines BL and BLB. With these embodiments, the sense amplifier does not have to drive the bit line capacitance during write back. Accordingly, the write back feature can be achieved while still enabling bit line/sense amplifier isolation during amplification.

Also with some embodiments described herein, because a sense amplifier is generally not coupled to the bit lines during a write back phase, the sense amplifier may be used to sense memory cells from multiple bit line pairs, thereby saving circuitry space.

Although the embodiments shown herein describe an SRAM memory, the write back feature as described herein maybe utilized with other types of memories for which read failure may be a problem.

In one embodiment, a memory includes a first pair of bit lines including a first bit line and a second bit line. The memory includes a word line and a first memory cell coupled to the word line, the first bit line, and the second bit line. The memory includes a sense amplifier including a first input, a second input, a first output, and a second output. The second output is a complementary output to the first output. The memory includes a first pair of coupling transistors including a first transistor and a second transistor. The first transistor is coupled between the first bit line and the first input of the sense amplifier and the second transistor is coupled between the second bit line and the second input of the sense amplifier. The memory includes a write back circuit including a first input coupled to the first output of the sense amplifier, a second input coupled to the second output of the sense amplifier, a first terminal coupled to the first bit line, and a second terminal coupled to the second bit line.

Another embodiment includes a method for performing a read cycle of a memory cell of a memory. The memory includes a first pair of bit lines including a first bit line and a second bit line, a word line, a first memory cell, and a sense amplifier. The first memory cell is coupled to the word line, the first bit line, and the second bit line. The method for performing a read cycle of the first memory cell includes enabling the word line, using the sense amplifier to determine a stored value of the memory cell during the step of enabling the word line, and decoupling the sense amplifier from the first pair of bit lines during the step of enabling. The method includes writing back the stored value as determined by the sense amplifier to the memory cell during the step of enabling and during a time after the step of decoupling.

Another embodiment includes a method for performing a read cycle of a first memory cell of a memory. The memory includes a first pair of bit lines including a first bit line and a second bit line, a word line, a first memory cell coupled to the word line and to the first pair of bit lines, and a sense amplifier. The method for performing a read cycle of the first memory cell includes enabling the word line to couple a first storage node and a second storage node of the first memory cell to the first bit line and the second bit line, respectively, to generate a voltage differential between the first bit line and the second bit line. The step of enabling the word line includes an initial portion and a subsequent portion. The method includes coupling the first pair of bit lines to the sense amplifier during the initial portion of the step of enabling, determining a value stored in the first memory cell by the sense amplifier, and decoupling the sense amplifier from the first pair of bit lines at an end of the initial portion. The method includes writing back to the first memory cell the determined value during the subsequent portion of the step of enabling the word line. The writing back includes biasing one of the first bit line or the second bit line to a supply voltage based on the determined value.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory, comprising:
    a first pair of bit lines comprising a first bit line and a second bit line;
    a word line;
    a first memory cell coupled to the word line, the first bit line, and the second bit line;
    a sense amplifier including a first input, a second input, a first output, and a second output, the second output being a complementary output to the first output;
    a first pair of coupling transistors comprising a first transistor and a second transistor, wherein the first transistor is coupled between the first bit line and the first input of the sense amplifier and the second transistor is coupled between the second bit line and the second input of the sense amplifier; and
    a write back circuit including a first input coupled to the first output of the sense amplifier, a second input coupled to the second output of the sense amplifier, a first terminal coupled to the first bit line, and a second terminal coupled to the second bit line;
    wherein the first terminal of the write back circuit is connected to the first bit line and the second terminal of the write back circuit is connected to the second bit line such that the write back circuit provides a path from one of the first bit line or the second bit line to a supply voltage terminal to write a first value or a second value respectively to the first memory cell during a write back phase of a read cycle of the first memory cell.

2. The memory of claim 1, wherein the supply voltage terminal is a ground terminal.

3. The memory of claim 1 wherein:
    the first transistor includes a control electrode for receiving a control signal and the second transistor includes a control electrode for receiving the control signal;
    the control signal causes the first transistor and the second transistor to become conductive during a first portion of a read cycle of the first memory cell and non-conductive during a second portion of the read cycle.

4. The memory of claim 1 wherein:
    the first memory cell is an SRAM memory cell;
    the first memory cell includes:
        a first storage node;
        a second storage node;
        a first access transistor including a control terminal connected to the word line, a first current terminal connected to the first bit line, and a second current terminal connected to the first storage node;
        a second access transistor including a control terminal connected to the word line, a first current terminal connected to the second bit line, and a second current terminal connected to the second storage node.

5. A memory, comprising:
a first pair of bit lines comprising a first bit line and a second bit line;
a word line;
a first memory cell coupled to the word line, the first bit line, and the second bit line;
a sense amplifier including a first input, a second input, a first output, and a second output, the second output being a complementary output to the first output;
a first pair of coupling transistors comprising a first transistor and a second transistor, wherein the first transistor is coupled between the first bit line and the first input of the sense amplifier and the second transistor is coupled between the second bit line and the second input of the sense amplifier; and
a write back circuit including a first input coupled to the first output of the sense amplifier, a second input coupled to the second output of the sense amplifier, a first terminal coupled to the first bit line, and a second terminal coupled to the second bit line;
wherein the sense amplifier determines a value stored in the first memory cell during a read cycle of the first memory cell, wherein the write back circuit writes back the determined value in the first memory cell during a write back phase of the read cycle.

6. The memory of claim 5 wherein the write back circuit includes a third input to receive a control terminal to selectively enable or disable the write back of the determined value to the first memory cell during a read cycle of the first memory cell.

7. The memory of claim 5 wherein the write back circuit includes a third input to receive a data signal to convey a data value, wherein the write back circuit writes the data value to the first memory cell during a write cycle to the first memory cell.

8. The memory of claim 5 wherein:
the first transistor includes a control electrode for receiving a control signal and the second transistor includes a control electrode for receiving the control signal;
the control signal causes the first transistor and the second transistor to become conductive during a first portion of a read cycle of the first memory cell and non-conductive during a second portion of the read cycle.

9. The memory of claim 5 wherein:
the first memory cell is an SRAM memory cell;
the first memory cell includes:
a first storage node;
a second storage node;
a first access transistor including a control terminal connected to the word line, a first current terminal connected to the first bit line, and a second current terminal connected to the first storage node;
a second access transistor including a control terminal connected to the word line, a first current terminal connected to the second bit line, and a second current terminal connected to the second storage node.

10. A memory, comprising:
a first pair of bit lines comprising a first bit line and a second bit line;
a word line;
a first memory cell coupled to the word line, the first bit line, and the second bit line;
a sense amplifier including a first input, a second input, a first output, and a second output, the second output being a complementary output to the first output;
a first pair of coupling transistors comprising a first transistor and a second transistor, wherein the first transistor is coupled between the first bit line and the first input of the sense amplifier and the second transistor is coupled between the second bit line and the second input of the sense amplifier; and
a write back circuit including a first input coupled to the first output of the sense amplifier, a second input coupled to the second output of the sense amplifier, a first terminal coupled to the first bit line, and a second terminal coupled to the second bit line;
wherein:
the first transistor includes a control electrode for receiving a control signal and the second transistor includes a control electrode for receiving the control signal;
the control signal causes the first transistor and the second transistor to become conductive during a first portion of a read cycle of the first memory cell and non-conductive during a second portion of the read cycle.

11. A memory, comprising:
a first pair of bit lines comprising a first bit line and a second bit line;
a word line;
a first memory cell coupled to the word line, the first bit line, and the second bit line;
a sense amplifier including a first input, a second input, a first output, and a second output, the second output being a complementary output to the first output;
a first pair of coupling transistors comprising a first transistor and a second transistor, wherein the first transistor is coupled between the first bit line and the first input of the sense amplifier and the second transistor is coupled between the second bit line and the second input of the sense amplifier; and
a write back circuit including a first input coupled to the first output of the sense amplifier, a second input coupled to the second output of the sense amplifier, a first terminal coupled to the first bit line, and a second terminal coupled to the second bit line;
wherein the write back circuit comprises:
a third input for receiving a data signal;
a fourth input for receiving a complementary signal of the data signal;
a first multiplexer including a first input coupled to the third input, a second input coupled to the first output of the sense amplifier, and an output, wherein the output of the first multiplexer provides a first control signal;
a second multiplexer including a first input coupled to the fourth input, a second input coupled to the second output of the sense amplifier, and an output, wherein the output of the second multiplexer provides a second control signal;
wherein during a read cycle of the first memory cell, the first multiplexer couples its second input to its output and the second multiplexer couples its second input to its output;
wherein during a write cycle of the first memory cell, the first multiplexer couples its first input to its output and the second multiplexer couples its first input to its output;
wherein the first control signal and the second control signal are used for determining whether to provide a current path from the first bit line to a voltage supply terminal or to provide a current path from the second bit line to a voltage supply terminal to write a first value or a second value, respectively, to the first memory cell during a write cycle or a write back phase of a read cycle of the first memory cell.

12. The memory of claim 11 wherein:
the first memory cell is an SRAM memory cell;
the first memory cell includes:
   a first storage node;
   a second storage node;
   a first access transistor including a control terminal connected to the word line, a first current terminal connected to the first bit line, and a second current terminal connected to the first storage node;
   a second access transistor including a control terminal connected to the word line, a first current terminal connected to the second bit line, and a second current terminal connected to the second storage node.

13. A memory, comprising:
a first pair of bit lines comprising a first bit line and a second bit line;
a word line;
a first memory cell coupled to the word line, the first bit line, and the second bit line;
a sense amplifier including a first input, a second input, a first output, and a second output, the second output being a complementary output to the first output;
a first pair of coupling transistors comprising a first transistor and a second transistor, wherein the first transistor is coupled between the first bit line and the first input of the sense amplifier and the second transistor is coupled between the second bit line and the second input of the sense amplifier; and
a write back circuit including a first input coupled to the first output of the sense amplifier, a second input coupled to the second output of the sense amplifier, a first terminal coupled to the first bit line, and a second terminal coupled to the second bit line;
wherein:
the first memory cell is an SRAM memory cell;
the first memory cell includes:
   a first storage node;
   a second storage node;
   a first access transistor including a control terminal connected to the word line, a first current terminal connected to the first bit line, and a second current terminal connected to the first storage node;
   a second access transistor including a control terminal connected to the word line, a first current terminal connected to the second bit line, and a second current terminal connected to the second storage node.

14. The memory of claim 13, wherein the first terminal of the write back circuit is connected to the first bit line and the second terminal of the write back circuit is connected to the second bit line such that the write back circuit provides a path from one of the first bit line or the second bit line to a supply voltage terminal to write a first value or a second value respectively to the first memory cell during a write back phase of a read cycle of the first memory cell.

15. The memory of claim 13 wherein:
the first transistor includes a control electrode for receiving a control signal and the second transistor includes a control electrode for receiving the control signal;
the control signal causes the first transistor and the second transistor to become conductive during a first portion of a read cycle of the first memory cell and non-conductive during a second portion of the read cycle.

16. A memory, comprising:
a first pair of bit lines comprising a first bit line and a second bit line;
a word line;
a first memory cell coupled to the word line, the first bit line, and the second bit line;
a sense amplifier including a first input, a second input, a first output, and a second output, the second output being a complementary output to the first output;
a first pair of coupling transistors comprising a first transistor and a second transistor, wherein the first transistor is coupled between the first bit line and the first input of the sense amplifier and the second transistor is coupled between the second bit line and the second input of the sense amplifier; and
a write back circuit including a first input coupled to the first output of the sense amplifier, a second input coupled to the second output of the sense amplifier, a first terminal coupled to the first bit line, and a second terminal coupled to the second bit line;
a second pair of bit lines comprising a third bit line and a fourth bit line;
a second memory cell coupled to the word line and to the second pair of bit lines;
a second pair of coupling transistors comprising a third transistor and a fourth transistor, wherein the third transistor is coupled between the third bit line and the first input of the sense amplifier and the fourth transistor is coupled between the fourth bit line and the second input of the sense amplifier; and
a second write back circuit including a first input coupled to the first output of the sense amplifier, a second input coupled to the second output of the sense amplifier, a first terminal coupled to the third bit line, and a second terminal coupled to the fourth bit line.

17. The memory of claim 16, wherein:
the first write back circuit includes a control input to receive a first control signal;
the second write back circuit includes a control input to receive a second control signal;
the first control signal causes the first transistor and the second transistor to become conductive during a first portion of a read cycle of the first memory cell and non-conductive during a second portion of the read cycle of the first memory cell; and
the second control signal causes the third transistor and the fourth transistor to become conductive during a first portion of a read cycle of the second memory cell and non-conductive during a second portion of the read cycle of the second memory cell.

18. The memory of claim 16 wherein:
the first transistor includes a control electrode for receiving a control signal and the second transistor includes a control electrode for receiving the control signal;
the control signal causes the first transistor and the second transistor to become conductive during a first portion of a read cycle of the first memory cell and non-conductive during a second portion of the read cycle.

19. The memory of claim 16 wherein:
the first memory cell is an SRAM memory cell;
the first memory cell includes:
   a first storage node;
   a second storage node;
   a first access transistor including a control terminal connected to the word line, a first current terminal connected to the first bit line, and a second current terminal connected to the first storage node;

a second access transistor including a control terminal connected to the word line, a first current terminal connected to the second bit line, and a second current terminal connected to the second storage node.

20. A method for performing a read cycle of a memory cell of a memory, the memory includes a first pair of bit lines including a first bit line and a second bit line, a word line, a first memory cell, and a sense amplifier, the first memory cell coupled to the word line, the first bit line, and the second bit line, the method for performing a read cycle of the first memory cell comprising:
  enabling the word line;
  using the sense amplifier to determine a stored value of the memory cell during the step of enabling the word line;
  decoupling the sense amplifier from the first pair of bit lines during the step of enabling; and
  writing back the stored value as determined by the sense amplifier to the memory cell during the step of enabling and during a time after the step of decoupling.

21. The method of claim 20, wherein the step of enabling the word line establishes a voltage differential on the first pair of bit lines based on the stored value.

22. The method of claim 20 wherein the step of decoupling isolates the sense amplifier from the first pair of bit lines, wherein the step of writing back biases one bit line of the first pair of bit lines to a supply voltage based on the stored value.

23. The method of claim 20 wherein the step of writing back during a read cycle is selectively dependent upon an assertion of a control signal.

24. The method of claim 23 further comprising:
  comparing an operating voltage of a memory to a reference voltage;
  asserting the control signal during the read cycle of the first memory cell if the operating voltage is less than the reference voltage;
  not asserting the control signal during the read cycle of the first memory cell if the operating voltage is greater than the reference voltage.

25. A method for performing a read cycle of a first memory cell of a memory, the memory includes a first pair of bit lines including a first bit line and a second bit line, a word line, a first memory cell coupled to the word line and to the first pair of bit lines, and a sense amplifier, the method for performing a read cycle of the first memory cell comprising:
  enabling the word line to couple a first storage node and a second storage node of the first memory cell to the first bit line and the second bit line, respectively, to generate a voltage differential between the first bit line and the second bit line, wherein the step of enabling the word line includes an initial portion and a subsequent portion;
  coupling the first pair of bit lines to the sense amplifier during the initial portion of the step of enabling;
  determining a value stored in the first memory cell by the sense amplifier;
  decoupling the sense amplifier from the first pair of bit lines at an end of the initial portion; and
  writing back to the first memory cell the determined value during the subsequent portion of the step of enabling the word line, the writing back including biasing one of the first bit line or the second bit line to a supply voltage based on the determined value.

26. The method of claim 25, wherein:
  the memory includes a second pair of bit lines including a third bit line and a fourth bit line, and a second memory cell coupled to the word line and the second pair of bit lines;
  the step of enabling the word line causes a first storage node and a second storage node of the second memory cell to be coupled to the second pair of bit lines;
  the second pair of bit lines being isolated from the sense amplifier during the step of coupling the first pair of bit lines to the sense amplifier during the initial portion of the step of enabling;
  the second pair of bit lines are coupled to the sense amplifier during a portion of a read cycle of the second memory cell.

27. The method of claim 25, further comprising:
  detecting a voltage level of an operating voltage for the memory;
  disabling the step of writing back if the voltage level of the operating voltage exceeds a threshold voltage.

28. The method of claim 25, wherein after the step of decoupling, a voltage differential indicative of the value stored in the first memory cell exists on first and second inputs of the sense amplifier during the step of writing back.

* * * * *